(12) United States Patent
Anthony et al.

(10) Patent No.: US 8,352,223 B1
(45) Date of Patent: Jan. 8, 2013

(54) NETWORK COMMUNICATIONS TESTBED

(75) Inventors: David Dow Anthony, Mission Viejo, CA (US); Daniel C. Mackley, Puyallup, WA (US); Michael Rhett Burke, Bellevue, WA (US); Christopher Douglas Barton, Seattle, WA (US)

(73) Assignee: The Boeing Company, Chicago, IL (US)

( * ) Notice: Subject to any disclaimer, the term of this patent is extended or adjusted under 35 U.S.C. 154(b) by 364 days.

(21) Appl. No.: 12/641,885

(22) Filed: Dec. 18, 2009

(51) Int. Cl.
*G06F 17/50* (2006.01)
*G06F 9/445* (2006.01)

(52) U.S. Cl. ............ 703/2; 703/17; 382/128; 455/67.11
(58) Field of Classification Search .............. 703/2, 17; 382/128; 455/67.11
See application file for complete search history.

(56) References Cited

U.S. PATENT DOCUMENTS

| | | | |
|---|---|---|---|
| 2007/0110290 A1* | 5/2007 | Chang et al. | 382/128 |
| 2010/0304686 A1* | 12/2010 | Kennedy et al. | 455/67.11 |

OTHER PUBLICATIONS

Mackley et al., "Imposing Communications Network effects Into a Real-Time Simulation Environment", AIAA Modeling and Simulation Technologies Conference and Exhibit, Aug. 2006, Keystone Colorado, pp. 1-10.
OPNET Technologies, 1 page, retrieved Oct. 28, 2009 http://www.opnet.com.
Scalable Network Technologies, pp. 1-2, retrieved Oct. 28, 2009 http://www.qualnet.com.
Advanced Networking Communications Planner for Operational and Simulation Effects with Realism (Composer), Lockkheed Martin Advanced Technology Laboratories (ATL), pp. 1-3, retrieved Oct. 28, 2009 http://www.atl.external.lunco.com/programs/composer.php.

* cited by examiner

*Primary Examiner* — Thai Phan
(74) *Attorney, Agent, or Firm* — Yee & Associates, P.C.

(57) ABSTRACT

The different advantageous embodiments provide a system for network communication testing comprising a communication effects server, a number of radio emulators, a number of radios, and a wireless link simulator. The communication effects computer is configured to provide a number of communication network effects. The number of radio emulators have a number of Ethernet signal-in-space emulators configured to output a number of Ethernet packets to the communication effects server. The number of radios is configured to transmit and receive messages over a radio frequency. The wireless link simulator is configured to provide simulated distance between the number of radios using real-time changes in a simulation running on a number of platforms.

20 Claims, 6 Drawing Sheets

NETWORK COMMUNICATIONS TESTBED

BACKGROUND INFORMATION

1. Field

The present disclosure relates generally to data processing systems and more particularly to network communications. Still more particularly, the present disclosure relates to network communications effects over radio networks.

2. Background

Radio communications are used in many operations between different space, aircraft, ground, and maritime platforms. Operation personnel often rely on radio communications to send and receive critical information during various operations. Terrain, environmental factors, and distance between radios may all contribute to constraints on ideal communication during these various operations. Test operations may be performed in order to properly assess these potential constraints and their impact on radio communications during actual operations.

Live field experimentation is not always practical or possible in order to test radio communications. The number of physical radios used during actual operations may be unavailable or cost-prohibitive to a test operation. In these situations, it may become necessary to augment live testing with virtual and constructive platforms operating over real, emulated, and simulated radio networks. Emulated and simulated radio networks may be used to represent additional physical radios and the actual constraints that may be encountered if the number of radios represented in the test operations where each physical radios operating at various locations or platforms in a real-world scenario.

Controlled test networks are often used for virtual and constructive testing using standard modeling and simulation protocols. This test network is typically established over a simple Ethernet network, which results in ideal or perfect communications. These ideal or perfect communications do not provide a realistic exercise of the radio network systems under test.

Therefore, it would be advantageous to have a method and apparatus that take into account one or more of the issues discussed above, as well as possibly other issues.

SUMMARY

The different advantageous embodiments provide a system for network communication testing, comprising a communication effects computer, a number of radio emulators, a number of radios, and a wireless link simulator. The communication effects computer is configured to provide a number of communication network effects. The number of radio emulators has a number of Ethernet signal-in-space emulators, configured to output a number of Ethernet packets to the communication effects computer. The number of radios is configured to transmit and receive messages over a radio frequency. The wireless link simulator is configured to provide simulated distance between the number of radios, using real-time changes in a simulation running on a number of platforms.

The different advantageous embodiments further provide a method for simulating radio communication constraints. A message from a radio on a platform is transmitted. A number of radios intended to receive the message is identified. A number of platforms associated with the number of radios is identified. Platform status information is identified for the number of platforms and the platform associated with the radio sending the signal. A number of communication effects is generated based on the platform status information. The message is transmitted using the number of communication effects.

The features, functions, and advantages can be achieved independently in various embodiments of the present disclosure, or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
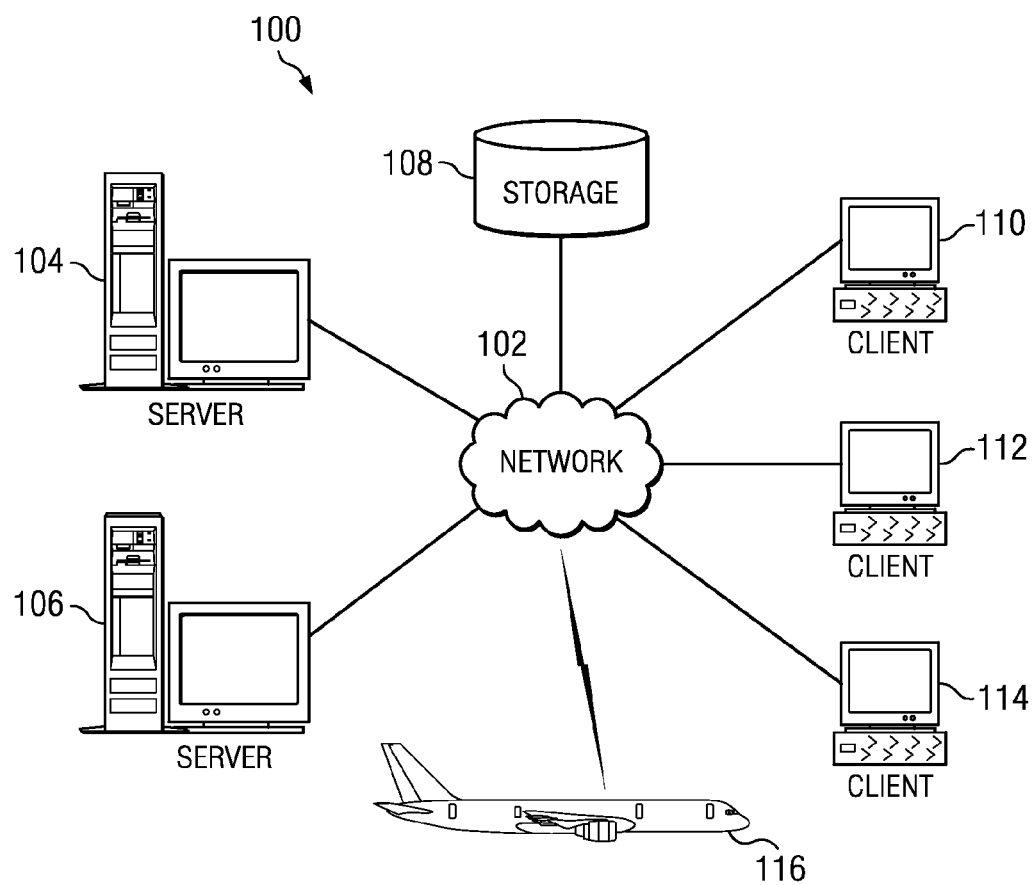
FIG. 1 is an illustration of a network of data processing systems in which the advantageous embodiments may be implemented.
Figure 2:
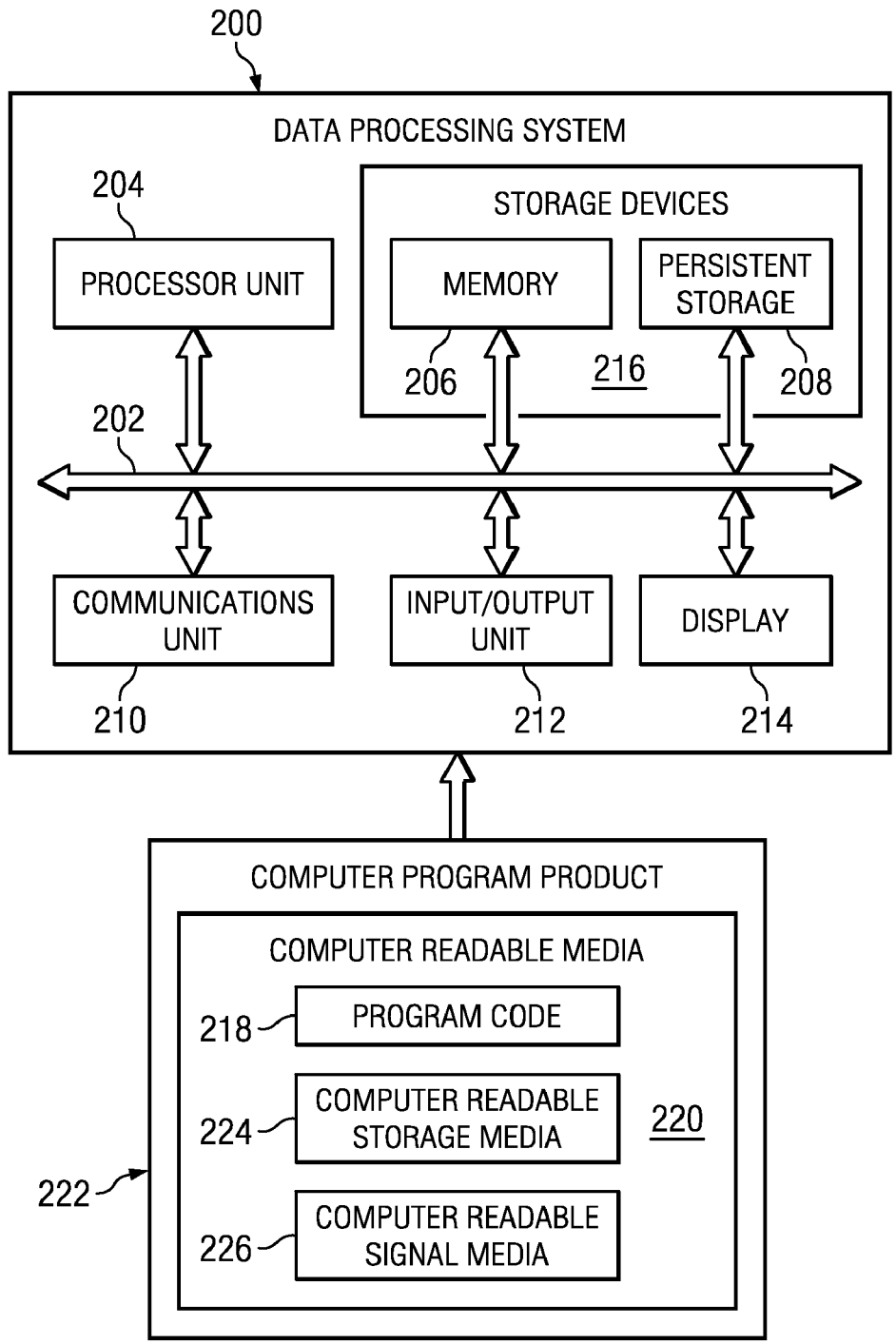
FIG. 2 is an illustration of a data processing system in accordance with an advantageous embodiment.

With reference now to the figures and in particular with reference to FIGS. 1-2, exemplary diagrams of data processing environments are provided in which the advantageous embodiments of the present invention may be implemented. It should be appreciated that FIGS. 1-2 are only exemplary and are not intended to assert or imply any limitation with regard to the environments in which different embodiments may be implemented. Many modifications to the depicted environments may be made.

With reference now to the figures, FIG. 1 depicts a pictorial representation of a network of data processing systems in which the advantageous embodiments of the present invention may be implemented. Network data processing system 100 is a network of computers in which embodiments may be implemented. Network data processing system 100 contains network 102, which is the medium used to provide communications links between various devices and computers, connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Aircraft 116 also is a client that may exchange information with clients 110, 112, and 114. Aircraft 116 also may exchange information with servers 104 and 106. Aircraft 116 may exchange data with different computers through a wireless communications link while in-flight, or any other type of communications link while on the ground. In these examples, server 104, server 106, client 110, client 112, and client 114 may be computers. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. Of course, network data processing system 100 also may be implemented as a number of different types of networks, such as, for example, an intranet, a local area network (LAN), or a wide area network (WAN). FIG. 1 is intended as an example, and not as an architectural limitation for different embodiments.

With reference now to FIG. 2, an illustration of a data processing system is depicted in accordance with an illustrative embodiment. Data processing system 200 is an example of a data processing system that may be used to implement servers and clients, such as server 104 and client 110 in FIG. 1. Further, data processing system 200 is an example of a data processing system that may be found in aircraft 116 in FIG. 1.

In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multiprocessor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example without limitation, data, program code in functional form, and/or other suitable information, either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications and/or programs may be located in storage devices 216, which are in communication with processor unit 204 through communications fabric 202. In these illustrative examples, the instructions are in a functional form on persistent storage 208. These instructions may be loaded into memory 206 for execution by processor unit 204. The processes of the different embodiments may be performed by processor unit 204 using computer implemented instructions, which may be located in a memory, such as memory 206.

These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 218 is located in a functional form on computer readable media 220 that is selectively removable and may be loaded onto or transferred to data processing system 200 for execution by processor unit 204. Program code 218 and computer readable media 220 form computer program product 222 in these examples. In one example, computer readable media 220 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 220 also may take the form of a persistent storage, such as a hard drive, a thumb drive, or a flash memory that is connected to data processing system 200. The tangible form of computer readable media 220 is also referred to as computer recordable storage media. In some instances, computer readable media 220 may not be removable.

Alternatively, program code 218 may be transferred to data processing system 200 from computer readable media 220 through a communications link to communications unit 210 and/or through a connection to input/output unit 212. The communications link and/or the connection may be physical or wireless in the illustrative examples. The computer readable media also may take the form of non-tangible media, such as communications links or wireless transmissions containing the program code.

In some illustrative embodiments, program code 218 may be downloaded over a network to persistent storage 208 from another device or data processing system for use within data processing system 200. For instance, program code stored in a computer readable storage medium in a server data processing system may be downloaded over a network from the server to data processing system 200. The data processing system providing program code 218 may be a server computer, a client computer, or some other device capable of storing and transmitting program code 218.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. The different embodiments may be implemented using any hardware device or system capable of executing program code. As one example, the data processing system may include organic components integrated with inorganic components and/or may be comprised entirely of organic components, excluding a human being. For example, a storage device may be comprised of an organic semiconductor.

As another example, a storage device in data processing system 200 is any hardware apparatus that may store data. Memory 206, persistent storage 208 and computer readable media 220 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

As used herein, the phrase "at least one of", when used with a list of items, means that different combinations of one or more of the items may be used and only one of each item in the list may be needed. For example, "at least one of item A, item B, and item C" may include, for example, without limitation, item A or item A and item B. This example also may include item A, item B, and item C or item B and item C.

The different advantageous embodiments recognize and take into account a number of different considerations. For example, the different advantageous embodiments recognize and take into account that current test networks are typically established over a simple Ethernet network, which results in ideal or perfect communications. These ideal or perfect communications do not provide a realistic exercise of the system under test.

The different advantageous embodiments further recognize and take into account that current systems for testing physical radios or radio emulators transmitting radio frequencies use radio frequency switching fabrics with physical radios and waveforms on the actual hardware. These systems become cost prohibitive when seeking to establish a testbed of more than a few dozen radios. In addition, these current systems tend to run against a static mobility scenario, or script, which does not permit a real time, interactive concept of operations analysis.

The different advantageous embodiments further recognize and take into account that current systems lack the ability to tie host users in the network, resulting in a low level of scalability. These existing systems are limited to providing realistic, high fidelity radio models at the expense of the number of nodes that can be tested. The use of live radios is very costly and limits testing to a few nodes. This does not provide a realistic environment, such as one where hundreds or thousands of nodes are in use simultaneously in the field, for example.

Thus, one or more of the different advantageous embodiments provide a system for network communication testing, comprising a communication effects server, a number of radio emulators, a number of radios, and a wireless link simulator. The communication effects server is configured to provide a number of communication network effects. The number of radio emulators has a number of Ethernet signal-in-space emulators configured to output a number of Ethernet packets to the communication effects server. The number of radios is configured to transmit and receive messages over a radio frequency. The wireless link simulator is configured to provide simulated distance between the number of radios using real-time changes in a simulation running on a number of platforms.

The different advantageous embodiments further provide a method for simulating radio communication constraints. A message from a radio on a platform is received. A number of radios intended to receive the message is identified. A number of platforms associated with the number of radios is identified. Platform status information is identified for the number of platforms and the platform associated with the radio sending the message. A number of communication effects is generated based on the platform status information. The message is transmitted using the number of communication effects.

Figure 3:
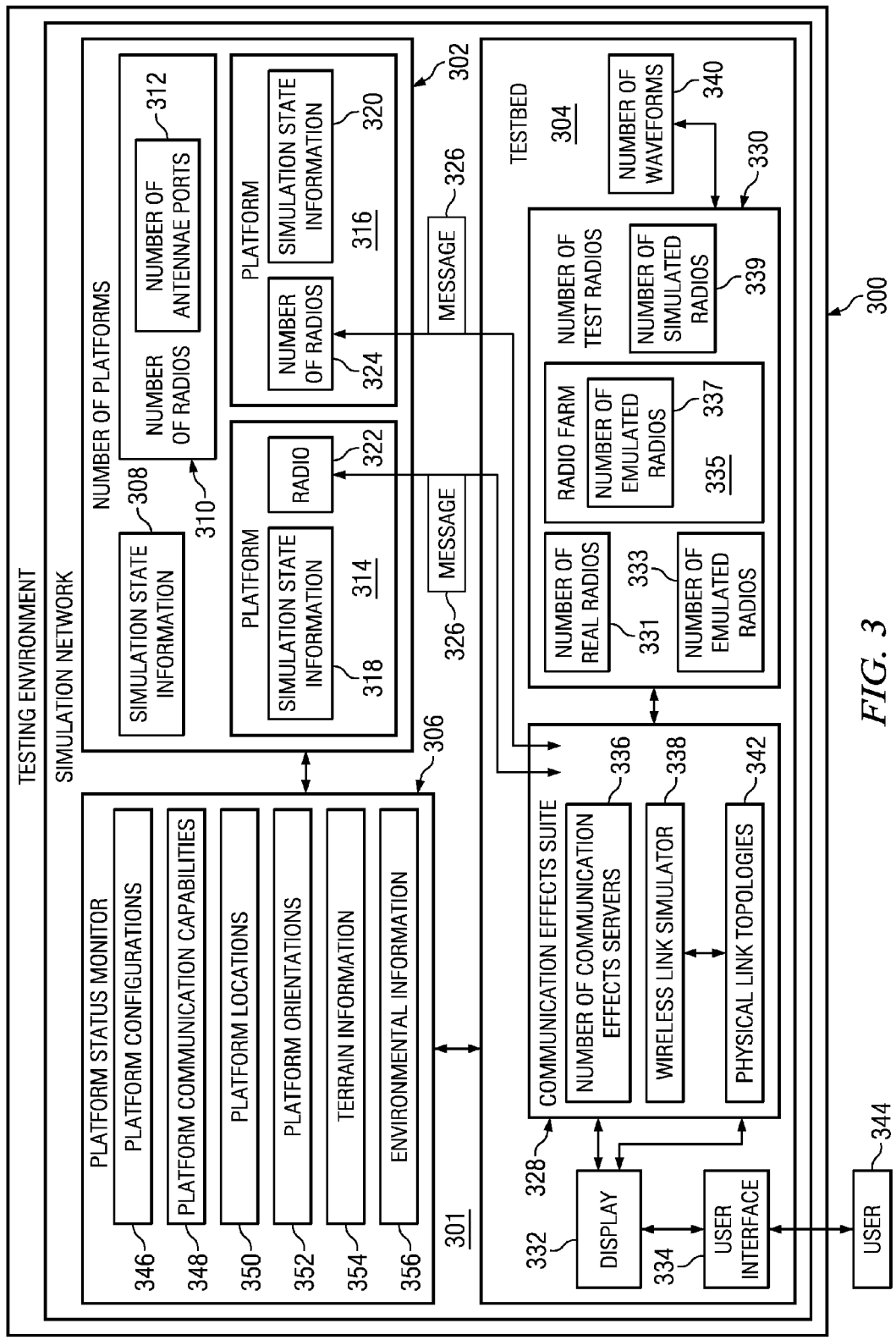
FIG. 3 is an illustration of a testing environment in accordance with an advantageous embodiment.

With reference now to FIG. 3, an illustration of a testing environment is depicted in accordance with an advantageous embodiment. Testing environment 300 may be implemented in a network environment, such as network 102 in FIG. 1, in an illustrative example.

Testing environment 300 includes simulation network 301. Simulation network 301 may be a hybrid real, emulated, and/or simulated network. Simulation network 301 includes a collection of live, virtual, and/or constructively generated platforms, each with their own location, orientation, configuration, and communication capabilities. Simulation network 301 supports and provides communication between radios associated with number of platforms 302, and radios in testbed 304. Number of platforms 302 may be any type of stationary or mobile platform with an associated on-board radio or communications terminal. Number of platforms 302 may include, for example, without limitation, spacecraft, aircraft, ground vehicles, surface vehicles, subsurface vehicles, dismounted soldiers, simulated platforms, and/or any other suitable type of platform. Number of platforms 302 is associated with simulation state information 308. Simulation state information 308 may include, for example, without limitation, platform location, configuration, capabilities, orientations, environmental and terrain information associated with a platform location, and/or any other suitable information. Platform location may be a real, virtual, and/or simulated location. Platform location may include, for example, without limitation, any geographic location, subsurface location, location in space, urban location, mountainous location, and/or any other suitable location.

Number of platforms 302 includes number of radios 310. Number of radios 310 may be real, emulated, and/or simulated radios. Real radios refer to legacy or transformational radios transmitting over radio frequency (RF) modulation. Emulated radios refer to non-production radios with actual field deployable waveform software transmitting either over radio frequency (RF) modulation and/or emulated signal in space (eSiS) over an Ethernet connection to communication effects suite 328. Simulated radios refer to data processing systems simulating radio frequencies or emulated radio frequencies. Each radio in number of radios 310 may have one or more waveforms or antenna represented.

Each platform in number of platforms 302 may include one or more radios from number of radios 310. Platform 314 and platform 316 may be an illustrative example of one implementation of number of platforms 302. In this illustrative example, platform 314 may be an air platform, such as a cockpit simulation. Platform 316 may be a ground platform, such as ground vehicles or dismounted soldiers, in one illustrative example. Platform 314 is associated with simulation state information 318, and platform 316 is associated with simulation state information 320. Simulation state information 318 may include a platform location in space, for example, while simulation state information 320 may include one or more geographic locations, in this example. Platform 314 includes radio 322. Platform 316 includes number of radios 324. Message 326 may be sent from radio 322 of platform 314 intended for reception by number of radios 324 of platform 316, in this illustrative example. Message 326 may be a radio communication, for example. Message 326 is sent to number of radios 324 via testbed 304 in testing environment 300. In another illustrative example, message 326 may be sent to testbed 304 for network testing using number of test radios 330.

Testbed 304 includes communication effects suite 328, number of test radios 330, display 332, and user interface 334. Communication effects suite 328 may be implemented using data processing system 200 in FIG. 2, for example. Communication effects suite 328 includes number of communication effects servers 336 and wireless link simulator 338. Wireless link simulator 338 is a radio frequency switching matrix used to impose real world constraints, or constraints that may be experienced by physical radios, on data messaging that is being transmitted over a network. Number of communication effects servers 336 impose real world constraints on data messaging being transmitted using an emulated signal in space, for example. Number of communication effects servers 336 and wireless link simulator 338 calculate a set of constraints such as, for example, without limitation, delays, dropouts, bit-errors due to weak radio frequency links, jamming, interference, and/or any other suitable constraint that may affect radio communications between physical radios.

Number of test radios 330 may be real, emulated, and/or simulated radios. In an illustrative example, number of test radios 330 may include number of real radios 331, number of emulated radios 333, number of simulated radios 339, and radio farm 335. Radio farm 335 includes number of emulated radios 337. Number of emulated radios 337 may include hundreds of radio emulators in one advantageous embodiment, for example. A radio farm may emulate multiple radios using a data processing system, such as data processing system 200 in FIG. 2, for example. Number of simulated radios 339 may receive messages, such as message 326, directly without interaction with communication effects suite 328, while number of real radios 331, number of emulated radios 333, and radio farm 335 interact with communication effects suite 328 to receive and/or transmit message 326. Number of test radios 330 may be associated with number of waveforms 340. Number of waveforms 340 refers to the shape and form of a signal used to transmit a message, such as message 326, for example. Each radio in number of test radios 330 may be associated with a different waveform from number of waveforms 340, for example. In one illustrative example, number of waveforms 340 may be downloaded into radio farm 335 to emulate a number of real-world, or physical, radios. Communication effects suite 328 provides connectivity degradation between number of test radios 330 and/or number of radios 310 associated with number of platforms 302 to simulate real world constraints on radio communications.

Number of waveforms 340 may include, for example, without limitation, Soldier Radio Waveform (SRW), Single Channel Ground Air Radio System (SINCGARS) with Enhanced SINCGARS Improvement Program (ESIP), HAVE QUICK II military aircraft radio, UHF SATCOM, Mobile User Objective System (MUOS), Enhanced Position Location Reporting System (EPLRS), Wideband Networking Waveform (WNW), and/or any other suitable waveform.

Wireless link simulator 338 creates a simulated distance, or attenuation, between number of radios 310 so that communication effects are emulated over number of antennae ports 312 that simulate real world constraints. Real world constraints refer to constraints experienced by physical radios operating at different physical locations, such as interference, for example. A simulated distance is an imitation of an actual, physical distance. Wireless link simulator 338 monitors platform status monitor 306 to acquire real-time position information on all platforms associated with the radios under test, such as number of radios 310 associated with number of platforms 302, for example. Wireless link simulator 338 creates physical link topologies 342 to emulate the wireless links connecting number of radios 310. Physical link topologies 342 is a representation of the wireless connections between number of radios 310. In one illustrative example, physical link topologies 342 may be a mobile ad hoc network topology. A mobile ad hoc network is a self-configuring network of mobile devices connected by wireless links.

Physical link topologies 342 may be viewed over display 332 by user 344 via user interface 334. Display 332 provides a graphical depiction of the locations of each of number of radios 310. This graphic depiction may also comprise physical link topologies 342 with a graphical depiction of the wireless connections between number of radios 310, which are within communications range of each other based on compatible waveform and frequency. Display 332 provides the capability to display network traffic, routing, and loading effects as calculated by communication effects suite 328. Display 332 also provides the capability to view a three-dimensional portrayal of a selected node's calculated radio range, taking into account terrain, environmental and electromagnetic interference effects.

In an illustrative example, wireless link simulator 338 may create simulated distance, terrain interference, and environmental interference so that signals received over number of antennae ports 312 of number of radios 310 experience real-world constraints based on the real-world location associated with the platforms in the simulation. Wireless link simulator 338 may monitor number of platforms 302 over simulation network 301 so that as the platform location changes, such as for platform 314, wireless link simulator 338 may adjust the connectivity constraints between simulated radio pairs after analyzing simulated distance, terrain, and environmental factors in real-time.

Platform status monitor 306 monitors the status of number of platforms 302 and shares simulation state information with testbed 304. Platform status monitor 306 may operate over a modeling and simulation data plane, for example. Platform status monitor 306 may include platform configurations 346, platform communication capabilities 348, platform locations 350, platform orientations 352, terrain information 354, environmental information 356, and/or any other suitable simulation state information. Wireless link simulator 338 may use information shared over platform status monitor 306 to adapt to changes in simulations run on number of platforms 302 and provide real-time wireless link information to communication effects suite 328 for use in selecting a communication effect to apply to a message, such as message 326.

The illustration of testing environment 300 in FIG. 3 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 4:
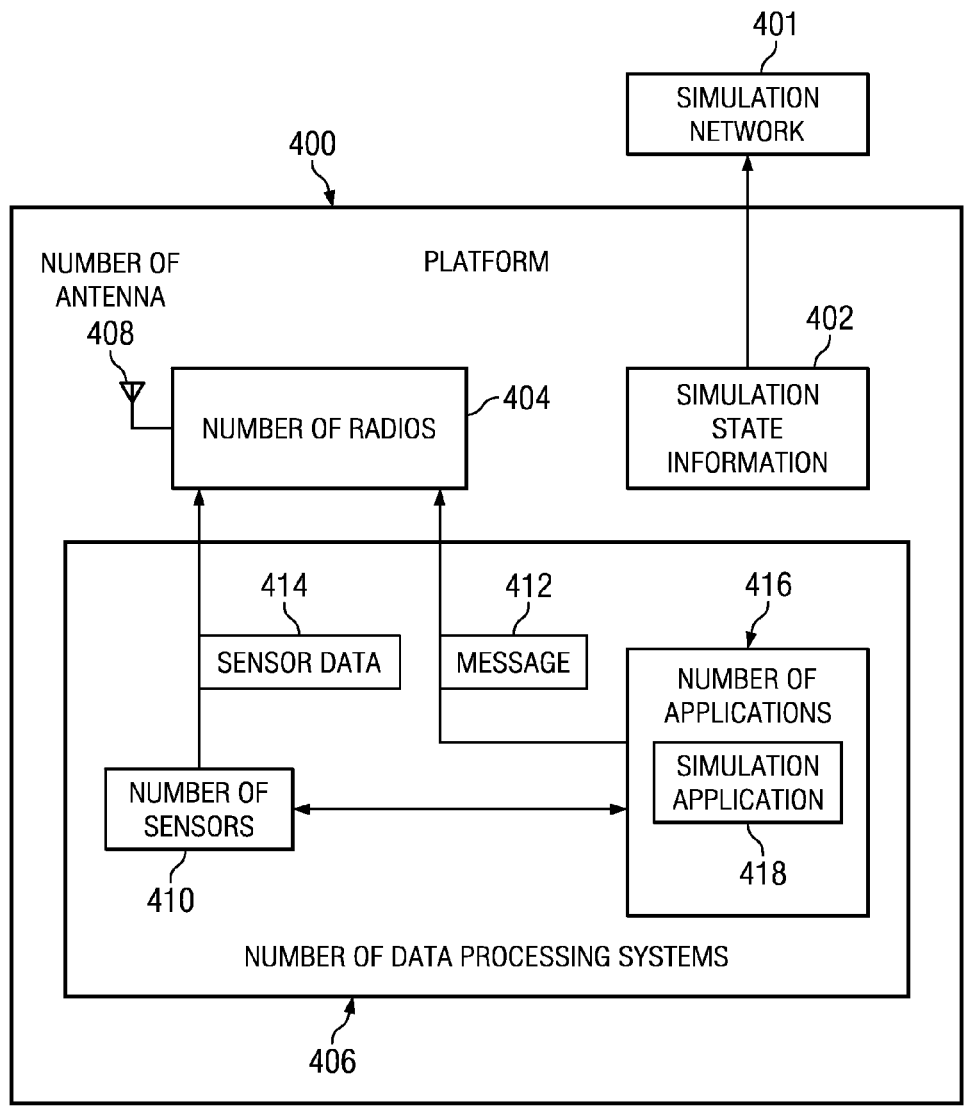
FIG. 4 is an illustration of a platform in accordance with an advantageous embodiment.

With reference now to FIG. 4, an illustration of a platform is depicted in accordance with an advantageous embodiment.

Platform 400 may be an illustrative example of one implementation of number of platforms 302 in FIG. 3.

Platform 400 may be a live, virtual, or constructive platform. A live platform may refer to a physical platform in contrast with a virtual platform. A virtual platform is a computer generated platform that is operated, or manipulated, by a human user. A constructive platform is a computer generated platform, which differs from a virtual platform in that the constructive platform is both generated and operated by the computer.

Platform 400 is associated with simulation state information 402. Simulation state information 402 may be an illustrative example of one implementation of simulation state information 308 in FIG. 3, which is shared over simulation network 401 in this illustrative example. In one advantageous embodiment, simulation state information 402 may be identified by platform 400 in the illustrative example of a live platform physically present at a location indicated in simulation state information 402. In another advantageous embodiment, simulation state information 402 may be generated by platform 400, such as in the illustrative example of a virtual or constructive platform.

Simulation state information 402 may include information on a number of states and/or capabilities of platform 400. States may include, for example, without limitation, the state of a radio or antenna associated with platform 400, the position of platform 400 in space, the orientation of platform 400, the direction and/or current heading of platform 400, a speed of travel for platform 400, the health of platform 400, and/or any other suitable state. In one advantageous embodiment, the state of platform 400 may be associated with a simulation application currently running on platform 400, such as simulation application 418 discussed below, for example. Capabilities may include, for example, without limitation, flightworthiness, maneuverability, carriage of weaponry, amount of weaponry carried, and capacity to deliver weaponry.

Platform 400 includes number of radios 404. Number of radios 404 may be an illustrative example of one implementation of number of radios 310 in FIG. 3. Number of radios 404 may be connected to number of data processing systems 406. Number of data processing systems 406 may be an illustrative example of one implementation of data processing system 200 in FIG. 2. Number of data processing systems 406 may be any type of system implemented by platform 400 including, for example, without limitation, a weapon system, sensor system, navigation system, mission system, communication system, and/or any other suitable type of system. Number of data processing systems 406 may include number of sensors 410 and number of applications 416. In one illustrative example, number of sensors 410 may transmit sensor data 414 directly to number of radios 404 to generate a radio communication over number of antennas 408. In another illustrative example, number of sensors 410 may transmit sensor data 414 to number of applications 416.

Number of applications 416 generates message 412 to be transmitted over number of radios 404. Message 412 may be, for example, voice, video, and/or digital data. Simulation application 418 may be an illustrative example of one type of number of applications 416. Number of applications 416 may run on number of data processing systems 406 and interact with number of radios 404 during a simulation exercise, for example.

The illustration of platform 400 in FIG. 4 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in one advantageous embodiment, simulation application 418 may be running on multiple platforms in addition to platform 400. In another advantageous embodiment, multiple simulation applications may be running on platform 400 simultaneously, for example. In yet another advantageous embodiment, multiple data processing systems in addition to number of data processing systems 406 may be implemented on platform 400, and number of radios 404 may be connected to each data processing system, for example, when multiple radio networks are attached to the same organic application onboard a platform to permit communication with other platforms operating on different waveforms and/or radio networks.

Figure 5:
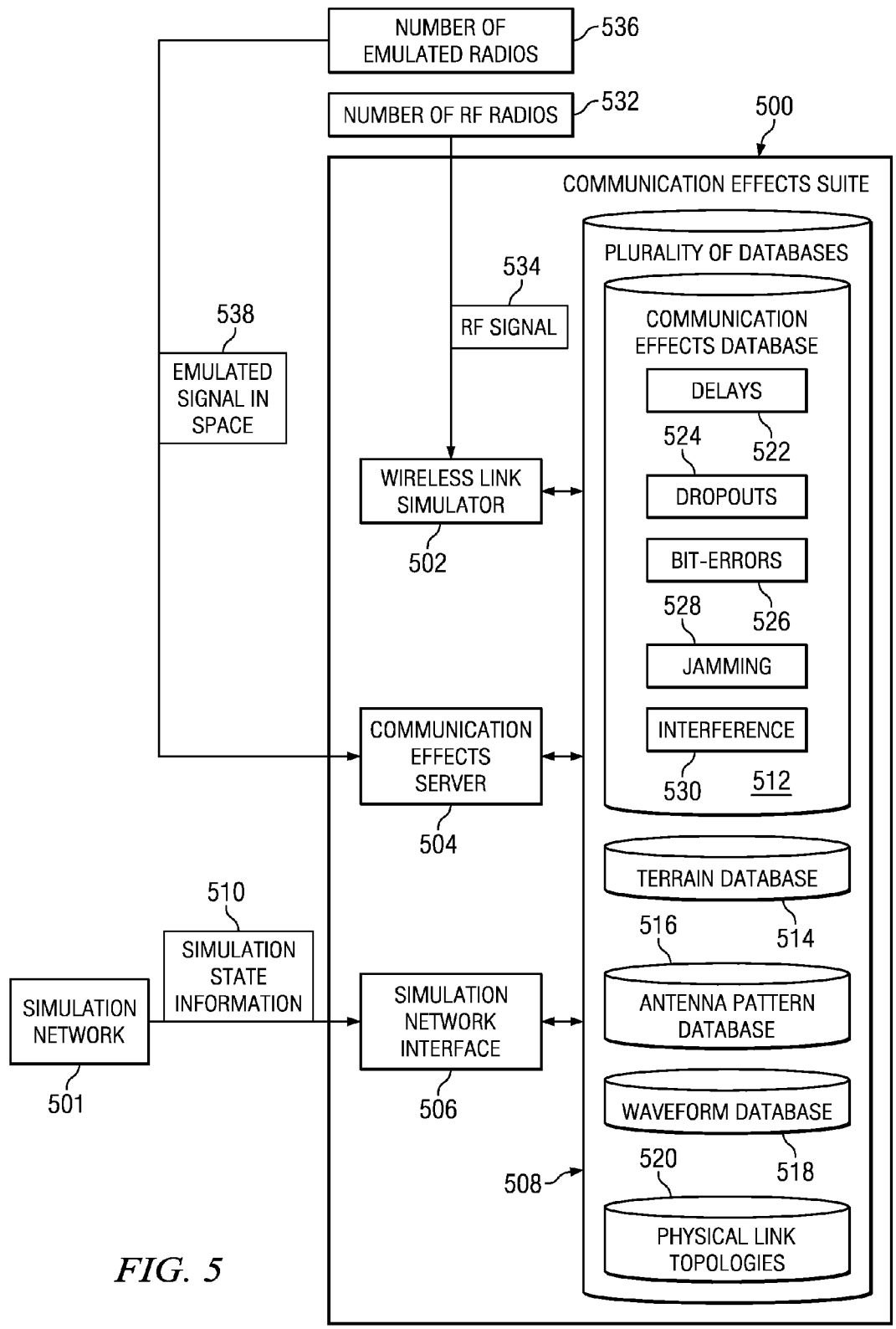
FIG. 5 is an illustration of a communication effects suite in accordance with an advantageous embodiment.

With reference now to FIG. 5, an illustration of a communication effects suite is depicted in accordance with an advantageous embodiment. Communication effects suite 500 may be an illustrative example of one implementation of communication effects suite 328 in FIG. 3.

Communication effects suite 500 may include wireless link simulator 502, communication effects server 504, simulation network interface 506, and plurality of databases 508. Wireless link simulator 502 may be an illustrative example of one implementation of wireless link simulator 338 in FIG. 3. Communication effects server 504 may be an illustrative example of one implementation of number of communication effects servers 336 in FIG. 3.

Simulation network interface 506 allows communication effects suite 500 to monitor simulation network 501 for simulation state information 510 of a number of platforms participating in a simulation. Simulation network interface 506 stores simulation state information 510 in plurality of databases 508. Simulation network 501 may be an illustrative example of one implementation of simulation network 301 in FIG. 3.

Plurality of databases 508 includes communication effects database 512, terrain database 514, antenna pattern database 516, waveform database 518, and physical link topologies 520. Communication effects database 512 includes communication effects algorithms for simulating real world constraints on radio communication. These algorithms may include delays 522, dropouts 524, bit-errors 526, jamming 528, interference 530, and/or any other suitable constraint.

Delays 522 may represent the extra time a message will take to be delivered from one radio to another via a network of radios, where each radio takes a quantifiable amount of time to receive and forward the message, for example. Dropouts 524 may represent missed or deleted portions or packets of a message or group of messages, which can be quantified probabilistically based on the characteristics of the radios and the conditions under which the message or messages were transmitted and propagated, for example. Bit-errors 526 may represent errors in individual binary bits of a message, for example. Jamming 528 may represent the effect of an electromagnetic signal of similar frequency to a radio transmission which can corrupt or disable the reception of that signal at its destination or destinations, for example. Interference 530 may represent electro-magnetic disruption of a signal due to environmental conditions, other signals of like frequency, or any other source of electro-magnetic energy, for example.

Terrain database 514 includes topographical data that is used to calculate terrain interference. The topographical data may include, for example, real life terrain data. Real life terrain data refers to samples of elevation taken at regular distance intervals throughout a region or regions of the Earth. These elevation samples, taken together, are a physical representation of the topology of simulation state information 308 in FIG. 3, for example. Other topographical data may include to actual data on physical terrain associated with a number of locations, such as simulation state information 308 in FIG. 3. For example, topographical data may include information on mountains, bodies of water, canyons, elevations, altitudes, and/or any other suitable terrain data.

Antenna pattern database 516 includes a number of different patterns of directional, or angular, dependence of radiation from an antenna to other sources. Communication effects server 504 and wireless link simulator 502 use information from antenna pattern database 516 to calculate radio frequency signal attenuation between platforms as the platforms alter position and orientation. This antenna pattern information may be used by communication effects suite 500 in conjunction with other factors such as signal power and frequency, for example, to determine connectivity with radio receivers that are capable of receiving these signals.

Waveform database 518 includes a number of different waveform software applications for various waveforms, such as number of waveforms 340 in FIG. 3. Waveform refers to the shape and form of a signal, such as a baseband input signal outputted as a radio frequency modulated signal over an antenna, for example. Waveform database 518 may include, for example, without limitation, Soldier Radio Waveform (SRW), Single Channel Ground Air Radio System (SINCGARS) with Enhanced SINCGARS Improvement Program (ESIP), HAVE QUICK II military aircraft radio, UHF SATCOM, Mobile User Objective System (MUOS), Enhanced Position Location Reporting System (EPLRS), Wideband Networking Waveform (WNW), and/or any other suitable waveform. Physical link topologies 520 may be a number of stored physical link topologies generated by wireless link simulator 502 during a number of simulations, for example.

Wireless link simulator 502 may transmit and receive RF signal 534 to and from number of radio frequency (RF) radios 532, while communication effects server 504 may transmit and receive emulated signal in space 538 to and from number of emulated radios 536. Emulated signal in space 538 provides communication with number of emulated radios 536 operating over Ethernet rather than real radio frequencies. Emulated signal in space 538 is a number of Ethernet packets output to simulate the communication effects between other radios in space.

The illustration of communication effects suite 500 in FIG. 5 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 6:
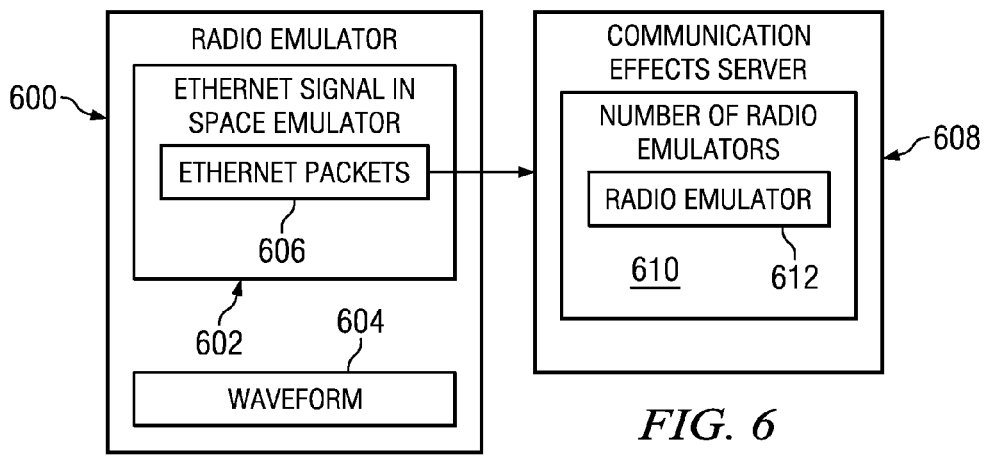
FIG. 6 is an illustration of a radio emulator in accordance with an advantageous embodiment.

With reference now to FIG. 6, an illustration of a radio emulator is depicted in accordance with an advantageous embodiment. Radio emulator 600 may be an illustrative example of one implementation of number of test radios 330 in FIG. 3. A real radio can interface with a radio frequency switch matrix, such as wireless link simulator 338 in FIG. 3, for example. An emulated radio can interface with wireless link simulator 338 or with an emulated signal in space generated by a communication effects server, such as communication effects server 504 in FIG. 5, for example.

Radio emulator 600 includes an Ethernet signal in space emulator 602 and a waveform 604. Radio emulator 600 may communicate with other radio emulators using Ethernet signal in space emulator 602. Ethernet signal in space emulator 602 is configured with the characteristics of waveform 604. Ethernet signal in space emulator 602 generates Ethernet packets 606 and sends Ethernet packets 606 to communication effects server 608. Communication effects server 608 may be an illustrative example of one implementation of communication effects suite 328 in FIG. 3.

Communication effects server 608 may include number of radio emulators 610 configured with characteristics of a number of different types of waveforms. Radio emulator 612 may be an example of a radio emulator type configured with the same characteristics of waveform 604, for example. Communication effects server 608 may be configured to house multiple radio waveforms, for example. Ethernet signal in space emulator 602 may be considered to be paired with radio emulator 612 of communication effects server 608, in this example. Each radio used in emulation may be paired with a communication effects server configured with the same waveform and signal in space characteristics.

The illustration of radio emulator 600 in FIG. 6 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 7:
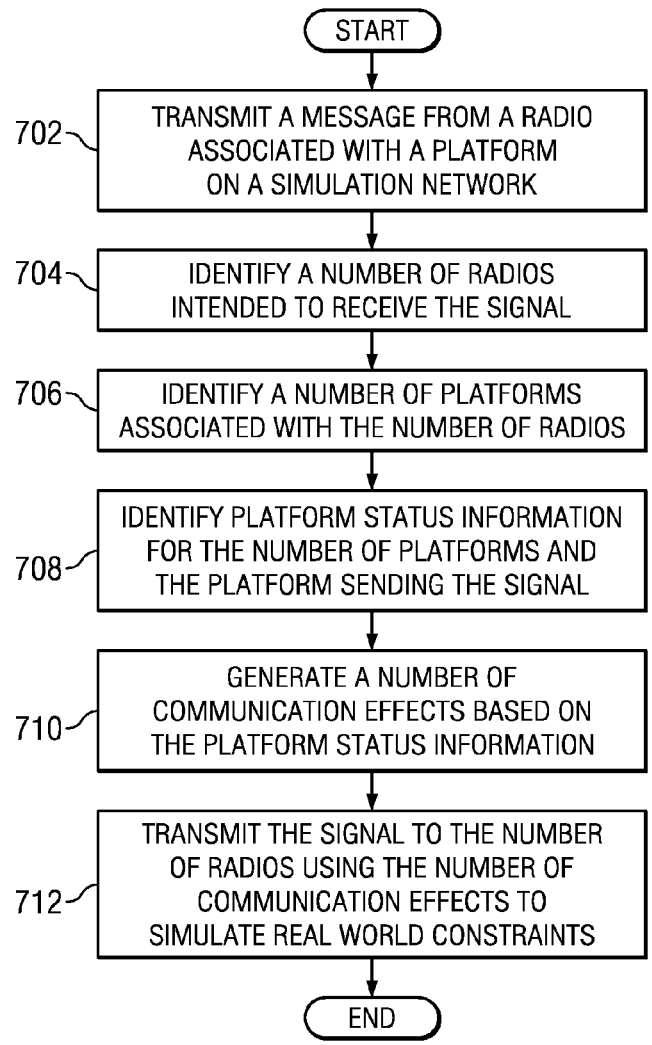
FIG. 7 is an illustration of a flowchart for simulating radio communication constraints in accordance with an advantageous embodiment.

With reference now to FIG. 7, an illustration of a flowchart for simulating radio communication constraints is depicted in accordance with an advantageous embodiment. The process in FIG. 7 may be implemented by a component such as communication effects suite 328 in FIG. 3, for example.

The process begins by transmitting a message from a radio associated with a platform on a simulation network (operation 702). The message may be, for example, a communication over a radio frequency modulation. The platform may be any type of platform, such as number of platforms 302 in FIG. 3, for example.

The process identifies a number of radios intended to receive the message (operation 704). The intended recipients can be determined, for example, by analyzing which of number of platforms 302 in FIG. 3 are within the calculated range of the signal transmitting the message, and which have the ability to tune the signal frequency. The calculated range is determined by mathematic algorithms, using the signal power, frequency, intervening terrain and environmental effects, and electromagnetic interference of various types and origins, such as other radios and jamming platforms. The number of radios may be one or more radios associated with one or more different platforms, for example.

The process identifies a number of platforms associated with the number of radios (operation 706). The process then identifies platform status information for the number of platforms and the platform sending the message (operation 708). The platform status information may be identified by accessing a platform status monitor, such as platform status monitor 306 in FIG. 3, over a simulation network, such as simulation network 301, for example.

The process then generates a number of communication effects based on the platform status information (operation 710). The number of communication effects may include, for example, without limitation, delays, dropouts, bit-errors, jamming, interference, and/or any other suitable effect. The process then transmits the message to the number of radios using the number of communication effects to simulate real world constraints (operation 712), with the process terminating thereafter.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

The different advantageous embodiments provide a system for analyzing and evaluating how well radios will operate in the field using simulations and emulated radios instead of live testing. Providing an Ethernet signal-in-space emulator to replace radio frequency switching fabrics mitigates the cost of network communication effects testing and increases the fidelity of testing for numerous radios.

The different advantageous embodiments can take the form of an entirely hardware embodiment, an entirely software embodiment, or an embodiment containing both hardware and software elements. Some embodiments are implemented in software, which includes, but is not limited to forms, such as, for example, firmware, resident software, and microcode.

Furthermore, the different embodiments can take the form of a computer program product accessible from a computer-usable or computer-readable medium providing program code for use by or in connection with a computer or any device or system that executes instructions. For the purposes of this disclosure, a computer-usable or computer readable medium can generally be any tangible apparatus that can contain, store, communicate, propagate, or transport the program for use by or in connection with the instruction execution system, apparatus, or device.

The computer usable or computer readable medium can be, for example, without limitation, an electronic, magnetic, optical, electromagnetic, infrared, or semiconductor system, or a propagation medium. Non limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W) and DVD.

Further, a computer-usable or computer-readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example, without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples of modems and network adapters are just a few of the currently available types of communications adapters.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system for network communication testing, the system comprising:
   a communication effects server configured to provide a number of communication network effects;
   a number of radio emulators having a number of Ethernet signal-in-space emulators configured to output a number of Ethernet packets to the communication effects server;
   a number of radios configured to transmit and receive messages over a radio frequency; and
   a wireless link simulator configured to provide simulated distance between the number of radios using real-time changes in a simulation running on a number of platforms.

2. The system of claim 1, wherein each radio in the number of radios is associated with a waveform in a number of waveforms.

3. The system of claim 1, wherein the communication effects server is associated with a number of waveforms.

4. The system of claim 1, wherein the number of communication network effects include at least one of a delay, dropout, bit-error, jamming, and interference.

5. The system of claim 1, further comprising:
   a simulation network supporting the number of platforms and configured to monitor platform status information during the simulation.

6. The system of claim 5, wherein the simulation network further monitors terrain information and environmental information for a number of locations associated with the number of platforms.

7. A method for simulating radio communication constraints, the method comprising:
   receiving a message from a radio on a platform;
   identifying a number of radios intended to receive the message;

identifying a number of platforms associated with the number of radios;

identifying platform status information for the number of platforms and the platform associated with the radio sending the message;

generating a number of communication effects based on the platform status information; and transmitting the message using the number of communication effects.

8. The method of claim 7, wherein the message is received over a simulation network.

9. The method of claim 7, wherein the platform status information is identified by accessing a platform status monitor over a simulation network.

10. The method of claim 7, wherein the radio is at least one of a real, emulated, or simulated radio.

11. The method of claim 7, wherein the number of radios is at least one of a real, emulated, or simulated radio.

12. The method of claim 7, wherein the number of platforms are at least one of a real, virtual, and constructive platform.

13. An apparatus comprising:
a communication effects suite configured to simulate a number of communication network effects; and
a number of test radios configured to transmit and receive messages over a simulation network, wherein the test radios comprise a radio emulator having an Ethernet signal-in-space emulator configured to output a number of Ethernet packets to a communication effects server.

14. The apparatus of claim 13, wherein the communication effects suite further comprises:
a number of communication effects servers configured to provide real world constraints on data messaging being transmitted using an emulated signal in space; and
a wireless link simulator configured to provide simulated distance between the number of test radios using real-time changes in a simulation running on a number of platforms.

15. The apparatus of claim 14, wherein the real world constraints are selected from at least one of delays, dropouts, bit-errors, jamming, and interference.

16. The apparatus of claim 14, wherein the wireless link simulator is further configured to generate physical link topologies to emulate the wireless links connecting the number of test radios.

17. The apparatus of claim 13, wherein the number of test radios further comprise at least one of a number of real radios, a number of emulated radios, a number of simulated radios, and a radio farm.

18. The apparatus of claim 17, wherein the radio farm emulates multiple radios using a data processing system.

19. The apparatus of claim 13, wherein the number of test radios is associated with a number of waveforms.

20. The apparatus of claim 13, wherein the communication effects suite provides connectivity degradation between the number of test radios and a number of radios associated with a number of platforms.

* * * * *